(12) United States Patent
Sawada

(10) Patent No.: US 7,045,886 B2
(45) Date of Patent: May 16, 2006

(54) SEMICONDUCTOR DEVICE AND METHOD OF FABRICATING THE SAME

(75) Inventor: Kanako Sawada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/375,146

(22) Filed: Feb. 28, 2003

(65) Prior Publication Data

US 2003/0222350 A1     Dec. 4, 2003

(30) Foreign Application Priority Data

Mar. 1, 2002   (JP) .............................. 2002-055285

(51) Int. Cl.
*H01L 23/02*    (2006.01)
*H01L 23/28*    (2006.01)
*H01L 23/34*    (2006.01)

(52) U.S. Cl. .................. 257/686; 257/777; 257/723; 257/778; 257/737; 257/738; 257/774

(58) Field of Classification Search ................ 257/686, 257/777, 723, 778, 787, 737, 780
See application file for complete search history.

(56) References Cited

U.S. PATENT DOCUMENTS 5,870,289 A *  2/1999  Tokuda et al. ............... 361/779
6,335,565 B1 * 1/2002  Miyamoto et al. .......... 257/686

FOREIGN PATENT DOCUMENTS

JP         2001-094033        4/2001

* cited by examiner

*Primary Examiner*—Nitin Parekh
(74) *Attorney, Agent, or Firm*—Finnegan, Henderson, Farbow, Garrett & Dunner, L.L.P.

(57) ABSTRACT

A semiconductor device is disclosed which has a first substrate with wiring formed thereon, a second substrate mounted above the first substrate with a conductive plug buried in the second substrate to penetrate between upper and lower surfaces thereof, a plurality of semiconductor chips mounted above the second substrate and having a terminal electrode as electrically connected to the first substrate through the conductive plug of the second substrate, and a resin buried in an empty space or gap between adjacent ones of the plurality of semiconductor chips.

8 Claims, 8 Drawing Sheets

US 7,045,886 B2

SEMICONDUCTOR DEVICE AND METHOD OF FABRICATING THE SAME

CROSS-REFERENCE TO RELATED APPLICATION(S)

This application is based upon and claims the benefit of priority from the prior Japanese Patent Application No. 2002-055285, filed on Mar. 1, 2002, the entire content of which is incorporated herein by reference.

BACKGROUND OF THE INVENTION

1. Field of the Invention

This invention relates to semiconductor devices of the multiple chip mount type with a plurality of semiconductor chips mounted on or above a substrate. The invention also relates to methodology of fabricating the multi-chip type semiconductor devices.

2. Description of Related Art

In recent years, multi-chip semiconductor devices with a plurality of semiconductor chips mounted on a substrate are becoming more and more important. Use of such multi-chip semiconductor devices is aimed at enhancement of performance and reliability of the equipment. Especially, in order to connect together a plurality of multi-pin/ultrafine-pitch semiconductor chips while permitting them to offer high-speed signal transmission capabilities, what is called the silicon interposer (Si-IP) technology attracts the attention of skilled persons, which employs a silicon substrate for use as an intermediate repeater or interexchange substrate that is interposed between an underlying base substrate and an overlying semiconductor chip or chips. A typical silicon interposer substrate is arranged so that more than one conductive through-going plug which penetrates between the upper and lower surfaces is buried to thereby achieve electrical interconnection between the semiconductor chip(s) being mounted thereon and the base or "underlay" substrate.

SUMMARY OF THE INVENTION

In accordance with one aspect of this invention, a semiconductor device comprises a first substrate with wiring formed thereon, a second substrate mounted above the first substrate with a conductive plug buried in the second substrate to penetrate between upper and lower surfaces thereof, a plurality of semiconductor chips mounted above the second substrate and having a terminal electrode as electrically connected to the first substrate through the conductive plug of the second substrate, and a resin buried in an empty space between adjacent ones of the plurality of semiconductor chips.

In accordance with another aspect of the invention, a method of fabricating a semiconductor device comprises mounting above a first substrate with wiring formed thereon a second substrate with a conductive plug buried therein to penetrate between upper and lower surfaces thereof, mounting above said second substrate a plurality of semiconductor chips having a terminal electrode as electrically connected through said conductive plug to said wiring, and burying a resin in an empty space between adjacent ones of said plurality of semiconductor chips.

DETAILED DESCRIPTION OF THE INVENTION

Several illustrative embodiments of this invention will be explained with reference to the accompanying drawings below.

EMBODIMENT 1

Figure 1:
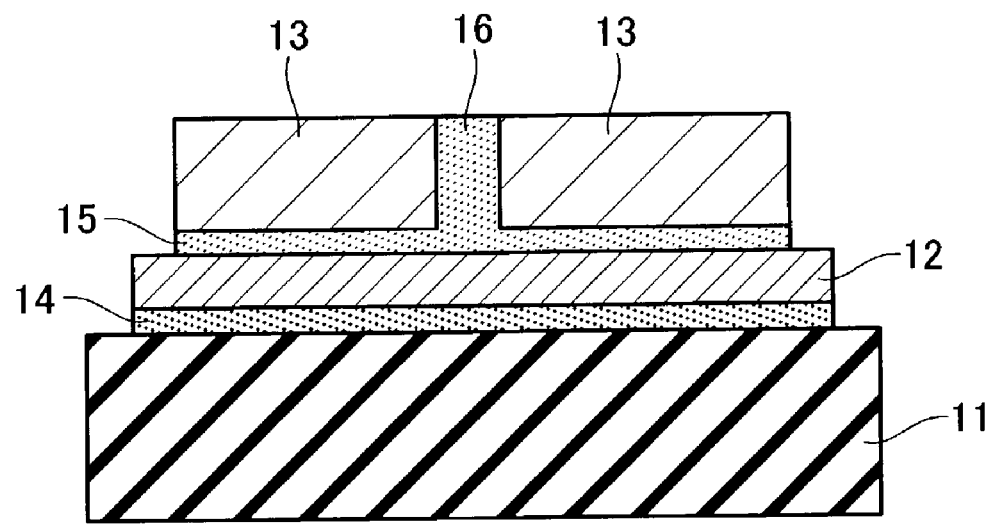
FIG. 1 is a drawing showing a cross-sectional structure of a semiconductor device in accordance with an embodiment 1 of this invention.

FIG. 1 illustrates, in cross-section, a structure of a semiconductor device in accordance with an embodiment of this invention. This device includes a dielectric substrate 11 for use as an underlay or base substrate. An intermediate substrate 12 made for example of silicon is mounted above the dielectric substrate 11. This silicon substrate 12 is for use as a repeater or interexchange substrate as will be referred to as "silicon interposer" hereinafter. On this silicon interposer (Si-IP) substrate 12, a plurality of semiconductor chips 13 are mounted. Laterally extending wiring leads for electrical interconnection are formed on the silicon interposer 12; in addition, conductive plugs are buried in the silicon interposer 12 so that each vertically goes through the silicon interposer 12 and penetrates between the upper and lower surfaces thereof as will be explained in detail later. Wiring leads and through-going plugs are formed on and in the dielectric substrate 11 also. And, each semiconductor chip 13 thus mounted has its terminal electrodes which are connected through conductive plugs of the silicon interposer 12 to corresponding ones of the wiring leads of dielectric substrate 11.

Practically, bumps are used to connect between the dielectric substrate 11 and the silicon interposer 12 and also between the silicon interposer 12 and the semiconductor chips 13. A chosen resin material 14 is sealed between the dielectric substrate 11 and silicon interposer 12; similarly, a resin 15 is between the silicon interposer 12 and semiconductor chips 13. Let a space gap 16 between laterally adjacent ones of the semiconductor chips 13 be as small as possible for high-speed signal transmission applications. For example, the chip gap measures 1 millimeter (mm) or less. And in the case of this embodiment, unlike the prior art, an empty space or gap between neighboring semiconductor chips 13 also is filled with resin material 16. Burying the resin 16 in the gap of semiconductor chips 13 as mounted on the silicon interposer 12 in this way results in that the silicon interposer 12 is enhanced in its resistance to cracking due to thermal stress-say, anti-cracking property. This point will be explained in detail below.

Figure 8:
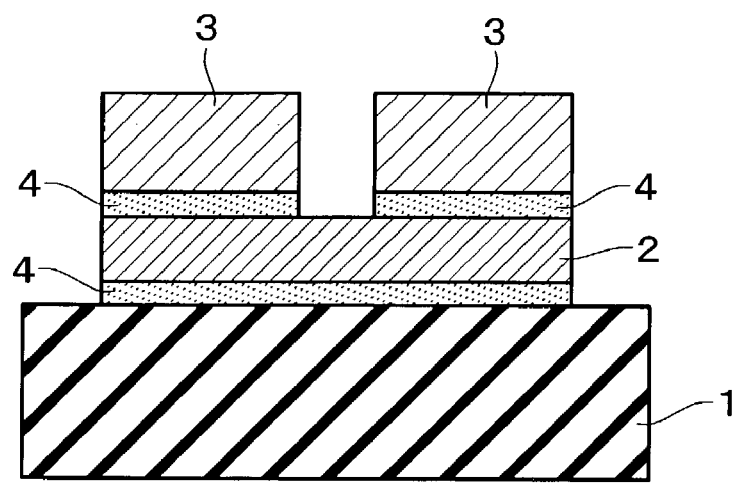
FIG. 8 is a sectional diagram of a multi-chip semiconductor device in accordance with an example for comparison purposes.

An explanation will first be given of a semiconductor device which is for use as an example for mere comparison purposes, called comparative example. Such a semiconductor chip-mounting structure is depicted in FIG. 8. This example has a three-layer structure including a base substrate 1 and an intermediate silicon interposer substrate 2 with a plurality of semiconductor chips 3 mounted on the silicon interposer 2. This multi-chip semiconductor device is to be mounted on a mother board (not shown) after attachment of a heat-sink cap or else in the event that this device is in practical use.

In the structure of FIG. 8, a resin 4 is sandwiched for sealing purposes between the substrate 1 and the silicon interposer 2 and also between the silicon interposer 2 and each semiconductor chip 3. One typical fabrication method of it is as follows. Firstly, attach by bonding the silicon interposer 2 onto the dielectric substrate 1. Then, use an underfill material or agent to seal by resin between the substrate 1 and silicon interposer 2. Next, cure the resin. Further, bond multiple chips 3 thereon; then, apply resin-sealing thereto by underfill material, thus curing the resin.

Although during resin sealing processes a resin-injection technique utilizing capillary action was employed after completion of the bonding process in the prior art, an alternative method has recently been developed which performs the bonding and sealing processes simultaneously in such a way as to perform deposition of a coating film of non-flow underfill material and disposal of a resin sheet prior to the bonding and then perform chip-bonding from above them.

In the silicon interposer (Si-IP), more than one conductive plug is buried in the form of penetration between the upper and lower surfaces of it. A typical approach to burying such interconnect plug is to employ a method having the steps of first defining ultrafine holes by etching in the surface of a Si substrate, burying a metal therein, and thereafter performing polishing to permit the bottom face of each conductive plug to be exposed from the back surface of the Si substrate. Thus, the resulting silicon interposer 2 becomes thinner.

The semiconductor device with multiple semiconductor chips mounted on the silicon interposer in the manner stated above is such that each of the constituent layers must be different in thermal expansion coefficient from the others, resulting in occurrence of thermal stress therein. In particular, the silicon interposer, which is thin and brittle—i.e. hard and easily crackable—among the three layers involved, is high in the risk of cracking upon application of a load such as temperature cycles.

Figure 9A:
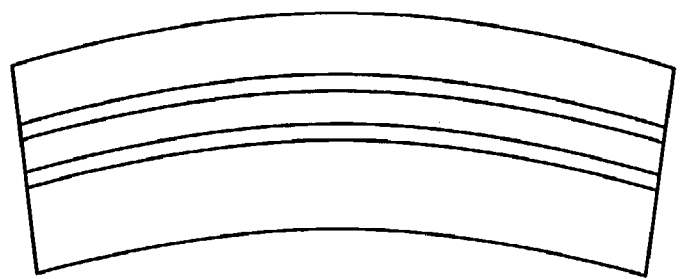
FIG. 9A is a diagram showing one possible form of a warped state occurring at low temperatures due to thermal stress of the semiconductor device shown in FIG. 8 when this device is regarded as a laminate plate with a multilayer structure.
Figure 9B:
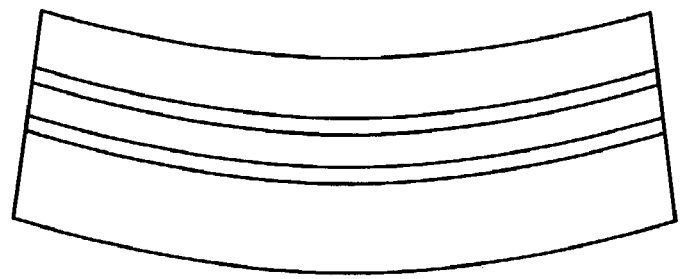
FIG. 9B is a diagram showing a form of the warped state occurring at high temperatures due to thermal stress of the semiconductor device shown in FIG. 8 when this device is regarded as a multilayer plate.
Figure 10A:
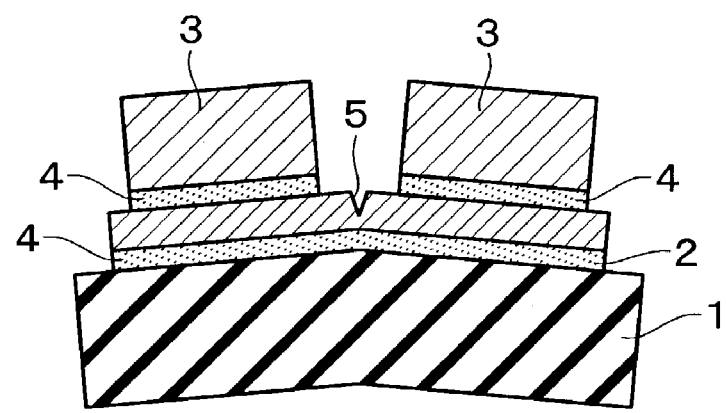
FIG. 10A is a diagram showing one possible form of the semiconductor device shown in FIG. 8 upon generation of a crack therein at low temperatures.

A more practical explanation is as follows. Generally, a laminated or multilayered plate can experience unwanted curving distortion, called the warp, due to the presence of thermal stress. For instance, at low temperatures, a "convex" warp takes place as shown in FIG. 9A; at high temperatures, a "concave" warp occurs as shown in FIG. 9B. However, in the case of the silicon interposer with multiple chips mounted thereon, its chip-mounting portions will hardly crack. This can be said because such chip mount portions stay high in physical strength or stiffness due to the fact that semiconductor chips thicker than the silicon interposer and the underfill material are mounted at these portions. For this reason, the stress is locally concentrated to a silicon interposer portion at part corresponding to a gap between adjacent chips. The result of such stress concentration is that this portion is bent causing a crack 5 to easily occur as shown in FIG. 10A (at low temperatures) and FIG. 10B (high temperatures). Especially, in cases where the layout interval or pitch of the semiconductor chips being mounted decreases to 1 mm or less, that is, in the case of ultrafine chip-mount pitches, the silicon interposer becomes easily crackable because it no longer elastically bends while absorbing thermal stress between chips.

Figure 2:
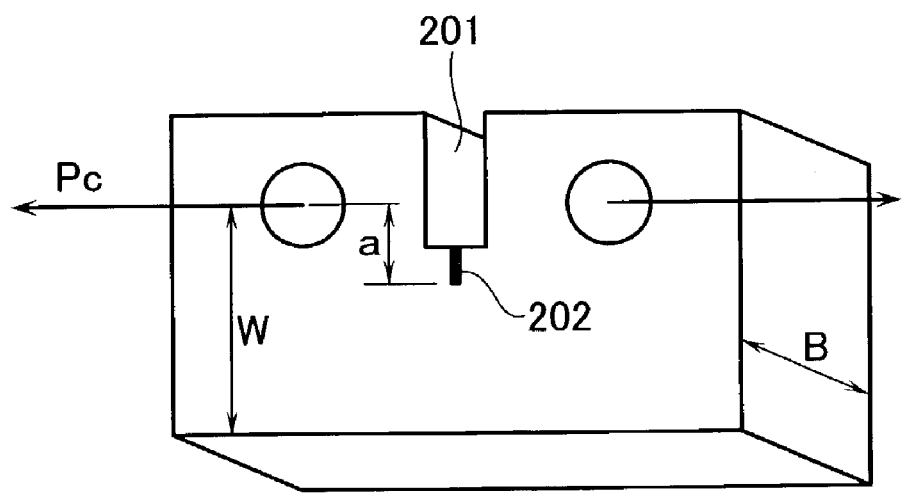
FIG. 2 is a diagram showing a perspective view of a notched specimen for use in compact tension tests, for explanation of an effect of the embodiment 1 of this invention.

The mechanism of crack generation of the silicon interposer used in the structure of the semiconductor device in accordance with the comparative example discussed above with reference to FIGS. 10A and 10B is much similar to the extension or "growth" of a crack fissure of a compact tension test specimen for use in fracture mechanics, which is shown in FIG. 2. This specimen being tested has its top surface in which a cutaway groove 201 is formed. Groove 201 has its bottom at which a crack 202 is present. As known among those skilled in the art, a plain-strain fracture toughness value KIC is used to represent the extendability of a crack of this specimen being tested. This fracture toughness value is given as:

$$KIC = (Pc/B \cdot W^{1/2}) f(á), \qquad (1)$$

$$á = a/W,$$

$$f(á) = á^{1/2}(29.6 - 185.5á + 655.7á^2 - 1017á^3 + 638.9á^4).$$

where Pc is the load the specimen sustains at the time of fracture.

Figure 10B:
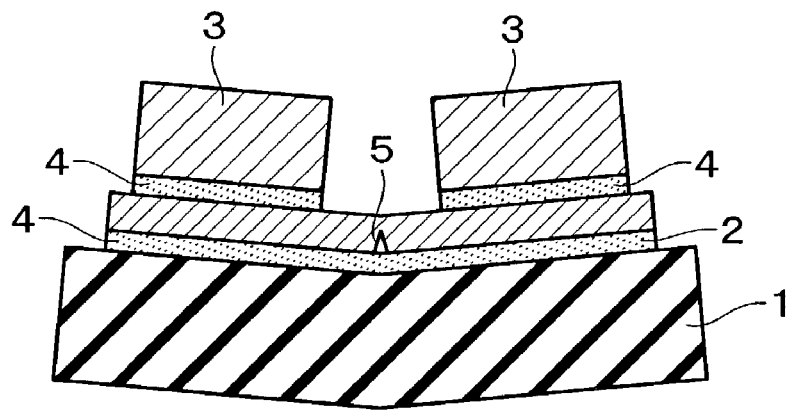
FIG. 10B is a diagram showing another form of the semiconductor device shown in FIG. 8 when cracked at high temperatures.

It would be readily seen from Equation (1) that in order to make the specimem with its fracture toughness value KIC, the load required increases with an increase in a specimem thickness B and also with a decrease in length or distance "a" spanning from the load-applied position of a cutaway portion (notch) up to the tip of a crack. The structures shown in FIGS. 10–10B are such that the empty space or gap between neighboring semiconductor chips corresponds to the cutaway groove 201 of the specimem shown in FIG. 2. Thus it is readily understandable from the analogy of the crack growth mechanism of the specimem that a crack tends to generate and grow up in the silicon interposer from its gap space portion. On the contrary, as in the embodiment device structure shown in FIG. 1, when the resin material 16 is buried in the gap space between the semiconductor chips 13, any crackable surface portion of the silicon interposer 12 is fully covered with the buried resin 16 resulting in the absence of cutaway grooves therein. Accordingly, the silicon interposer 12 may be noticeably improved in anti-cracking property. In particular, when the semiconductor chip mounted are less in planar layout pitch, there are no margins for creation of an elastic distortion which serves to suppresses or "relaxes" the thermal stress among the semiconductor chips, resulting in cracks being easily occurrable. Consequently, expected effects and advantages become greater in particular in case the semiconductor chip mount pitch is as small as 1 mm or less.

A brief explanation will be given of the reason why the chip mount pitch becomes 1 mm or less. In the case where signals are transmitted among the semiconductor chips at ultrahigh speeds, it is required to maximally shorten the wiring leads used for interconnection among these semiconductor chips. To do this, the layout interval or pitch between laterally adjacent semiconductor chips must be set as small as possible. The result of this is a semiconductor device of the structure with chip mount pitch (i.e. the width of an empty space between semiconductor chips) being set at 1 mm or less.

An explanation will next be given of a method of fabricating the semiconductor device of this embodiment.

Figure 3A:
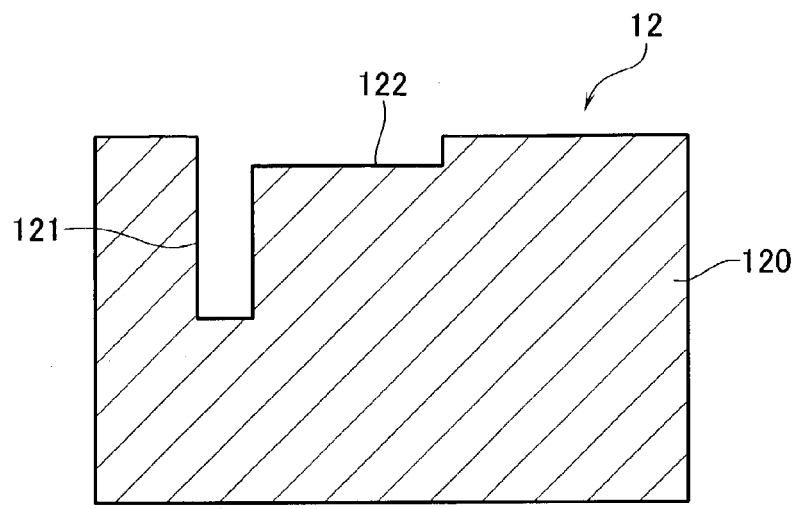
FIG. 3A is a cross-sectional diagram showing a process step of forming a hole of a silicon interposer and a wiring groove of the embodiment.

FIGS. 3A through 3E illustrate, in cross-section, some major process steps in the manufacture of the silicon interposer 12 stated supra. First, as shown in FIG. 3A, apply etching to the top surface of a silicon substrate 120 to thereby define a hole 121 therein. In the case of forming by copper (Cu) burying techniques both a conductive plug to be later buried in this hole 121 and its associated wiring lead coupled thereto, further etch the silicon substrate 120 to form a wiring groove 122. Whereby, a dual damascene structure is obtained.

Figure 3B:
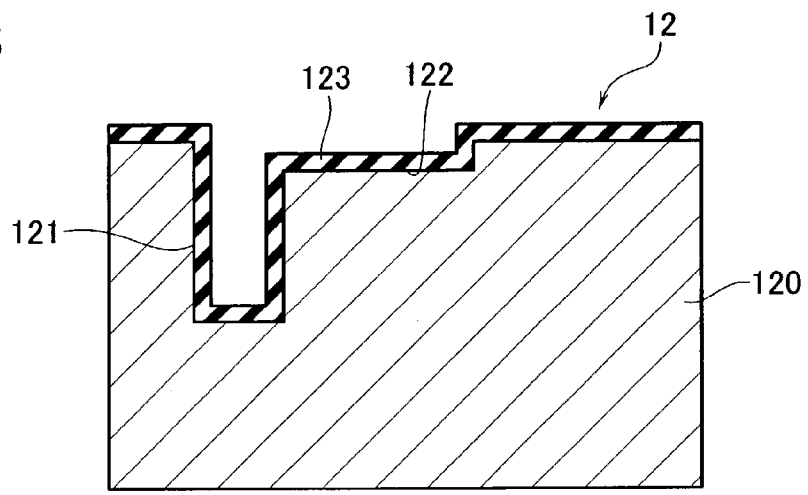
FIG. 3B is a sectional diagram showing a step of forming a dielectric film of the silicon interposer of the embodiment.
Figure 3C:
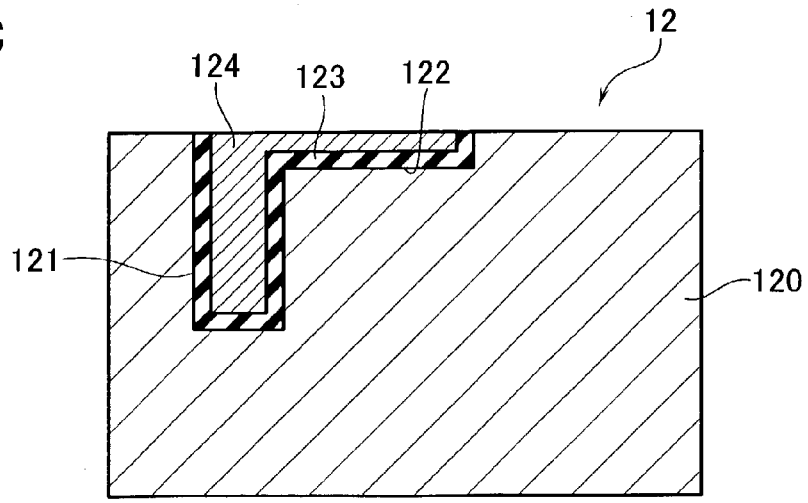
FIG. 3C is a sectional diagram showing a metal burying step of the silicon interposer of the embodiment.

Next, as shown in FIG. 3B, form a dielectric film 123 on the substrate surface of the hole 121 and wiring groove 122 thus etched. The dielectric film 123 is a chemical vapor deposition (CVD) oxide film, by way of example. Then as shown in FIG. 3C, bury a metal 124 such as Cu or the like within the hole 121 and the wiring groove 122. This metal 124 is for use as a conductive plug and an interconnect wiring lead(s). In case this metal burying process is performed by plating techniques, a process is necessary of forming a seed layer on a top surface of the dielectric film 123, although this seed layer is not depicted herein. Note that in the case of forming the metal 124 by Cu-plating, a Cu layer is formed on the entire surface. In this case, let any unnecessary Cu layer be removed away by chemical-mechanical polishing (CMP) techniques, thus obtaining the structure of FIG. 3C.

Figure 3D:
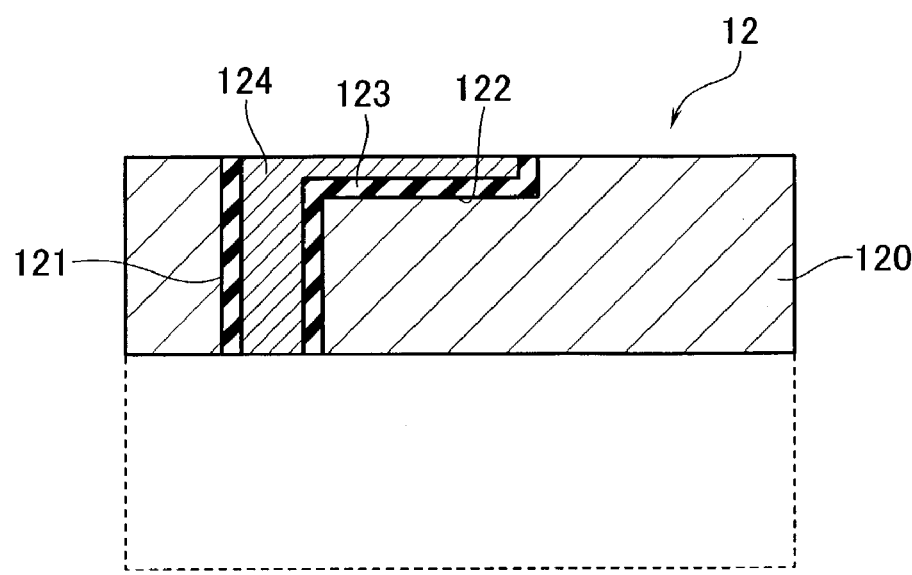
FIG. 3D is a sectional diagram showing a grinding, polishing step of the silicon-interposer of the embodiment.
Figure 3E:
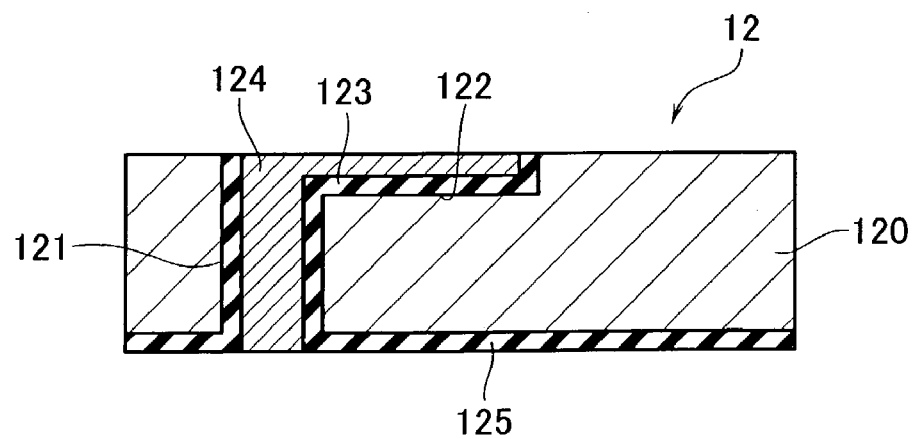
FIG. 3E is a sectional diagram showing a dielectric film fabrication step of the silicon interposer of the embodiment.

Next as shown in FIG. 3D, apply polishing and rubbing processes to the bottom or back surface of the silicon substrate 120, causing the metal 124 for use as a conductive plug to be exposed to the back surface. Lastly, as shown in FIG. 3E, form a dielectric film 125 also on the back face of the silicon substrate 120 for improvement in reliability, resulting in only the conductive plug being exposed.

Figure 4A:
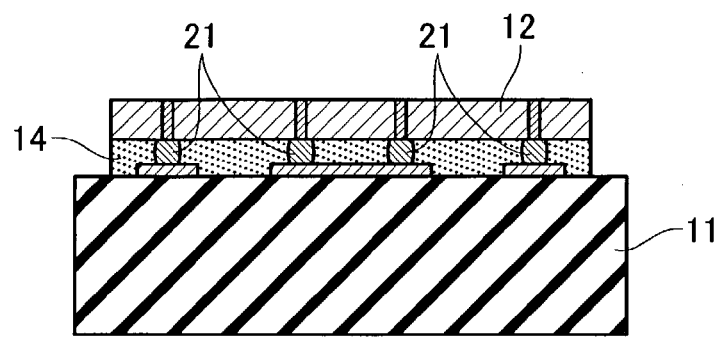
FIG. 4A is a sectional diagram showing a silicon interposer mounting step of the embodiment.
Figure 4B:
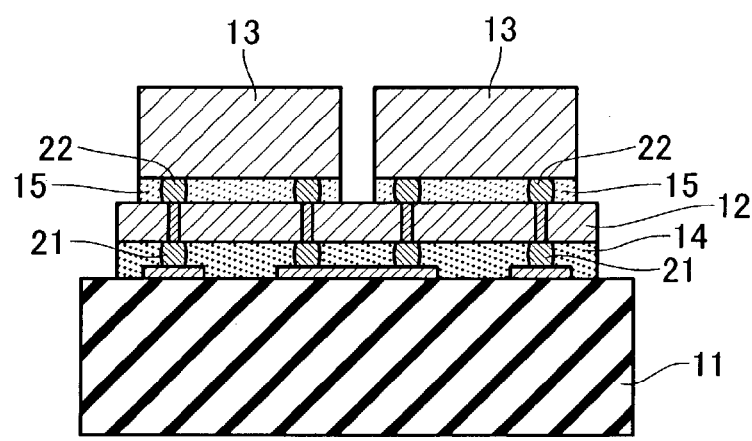
FIG. 4B is a sectional diagram showing a semiconductor chip mounting step of the embodiment.
Figure 4C:
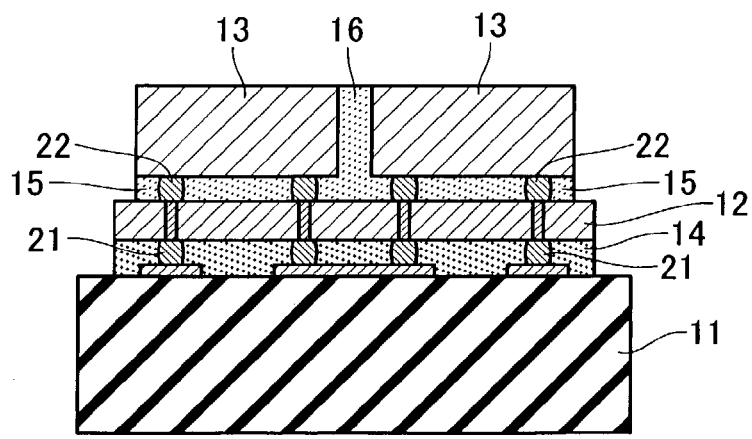
FIG. 4C is a sectional diagram showing a step of burying resin material between semiconductor chips of the embodiment.

FIGS. 4A to 4C depict, in cross-section, major steps in the process of mounting semiconductor chips by using the silicon interposer 12 thus obtained in the way stated above. First, as shown in FIG. 4A, connect a prewired dielectric substrate 11 with wiring leads preformed thereon and the silicon interposer 12 together by bonding techniques; then, seal between them by a resin material 14. In order to perform such bonding with increased reliability, it is desirable that either one or both of the substrate 11 and the silicon interposer 12 is/are such that a bump 21 is formed at the individual terminal electrode thereof.

This bonding and resin sealing processes may be arranged so that an underfill resin material is sealed by use of capillarity after completion of the bonding; or alternatively, bonding and sealing are done simultaneously while letting a non-flow underfill material and/or a film-shaped resin be mounted in advance or "pre-mounted" on the substrate. Thereafter, perform after-cure treatment of the resin. This curing may alternatively be done at a later resin cure step in an all-at-once fashion.

Next, as shown in FIG. 4B, mount multiple semiconductor chips 13 on the silicon interposer 12. This process step also is similar to the step of mounting the silicon interposer 12 to the substrate 11 in that any empty space between them is filled with resin material 15 for sealing purposes. To perform bonding with increased reliability, it is desirable that the chip 13 and/or the silicon interposer 12 is/are such that a bump 22 is formed at the individual terminal electrode thereof. This bonding and resin sealing processes may be arranged so that an underfill resin material is sealed by use of capillarity after completion of the bonding; or alternatively, bonding and sealing are done simultaneously while letting a non-flow underfill material and/or a film-shaped resin be pre-mounted on the substrate. Thereafter, perform after-cure treatment of the resin.

Lastly as shown in FIG. 4C, dispense resin material 16 at a gap between adjacent ones of the multiple semiconductor chips 13 to thereby fill the gap with the resin. Further, apply after-curing to the resin. Principally the above-stated process up to this step is the process unique to this invention. Thereafter, any required components may be added in a way depending upon specifications of the semiconductor device, including but not limited to a cap for heat release and warp correction purposes.

EMBODIMENT 2

Although in the above embodiment the resin filling to semiconductor chip bottoms and the resin filling into gaps or voids between adjacent semiconductor chips are done at separate steps, these may also be done at a single step. An embodiment employing such scheme will be explained with reference to FIGS. 5A and 5B below.

Figure 5A:
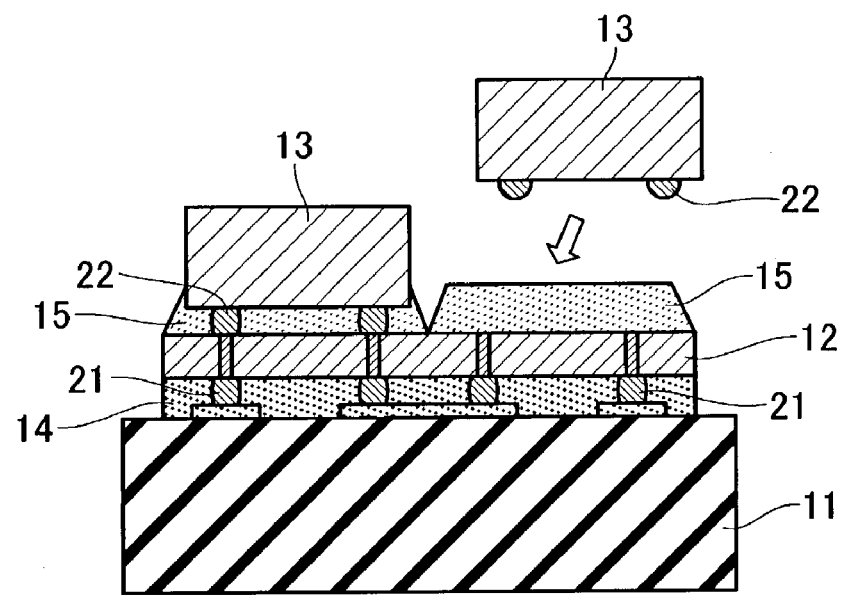
FIG. 5A is a sectional diagram for explanation of a semiconductor chip mounting step in accordance with an embodiment 2 of the invention.
Figure 5B:
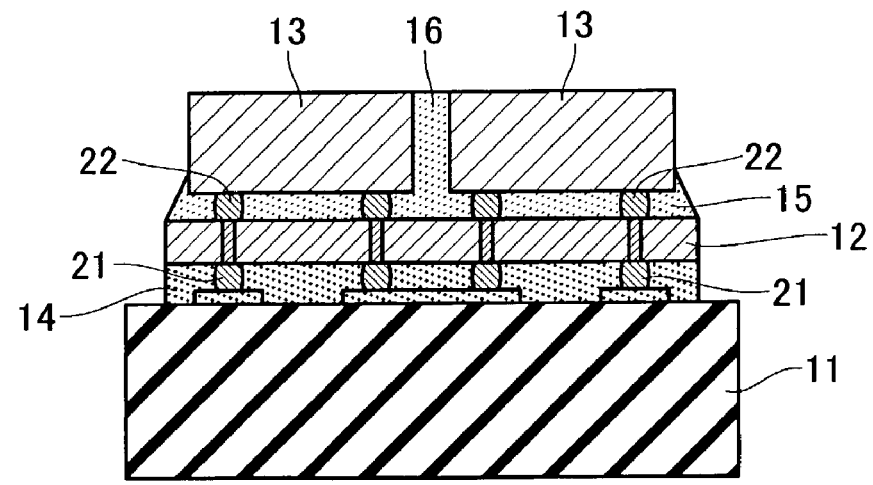
FIG. 5B is a sectional diagram for explanation of a semiconductor chip mount step in accordance with the embodiment.

The process up to the step of bonding a silicon interposer 12 onto a dielectric substrate 11 followed by resin sealing is the same as that of the previous embodiment. The step of mounting semiconductor chips 13 onto the silicon interposer 12 is as follows. As shown in FIG. 5A, place a painted film or sheet-like resin material 15 on the silicon interposer 12 prior to execution of bonding. This resin film or sheet 15 is thicker than its inherently required thickness for semiconductor chip sealing purposes. And, when bonding the individual semiconductor chip 13, extruded portions of the resin 16 from the bottom of semiconductor chip 13 is filled into a gap space between adjacent semiconductor chips 13 as shown in FIG. 5B.

In this way, in case multiple chips to be mounted on the silicon interposer 12 are narrow in layout gap space, it is possible by controlling the amount of chip-sealing resin material to eliminate the step of filling the gap between semiconductor chips with the resin as buried therein.

EMBODIMENT 3

Figure 6:
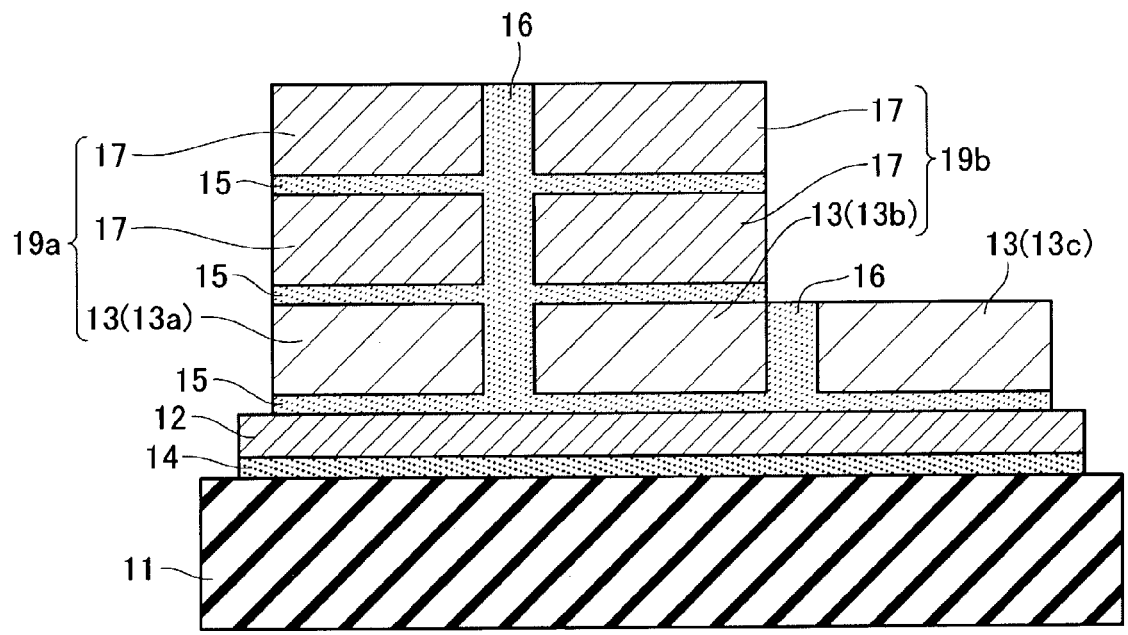
FIG. 6 is a sectional diagram of a semiconductor device in accordance with an embodiment 3.

FIG. 6 shows a cross-sectional view of a semiconductor device in accordance with an embodiment 3 of this invention. Parts or components corresponding to those of the embodiment 1 shown in FIG. 1 are referenced with the same reference characters, and a detailed explanation thereof is omitted. The semiconductor device in accordance with the embodiment 3 has at a portion a structure with semiconductor chips mounted and multilayered into a three-stage form—say, partial three-layer lamination structure.

More specifically, in the embodiment 3, a number of semiconductor chips 13 are mounted on and above a silicon interposer 12. A pair of neighboring semiconductor chips 13 (13a, 13b) is arranged so that two semiconductor chips 17 are stacked or laminated above one semiconductor chip 13a to thereby form a laminate body 19a while letting two semiconductor chips 17 be stacked above the remaining semiconductor chip 13b of the chip pair to thereby form a laminate body 19b. Resin 16 is buried in an empty space or gap between these laminate bodies 19a, 19b.

The gap between the laminate bodies 19a–19b becomes greater in depth when compared to the case of FIG. 1. This would result in an increase in influenceability of cutaway effects. In view of this, filling the gap between the laminate bodies 19a–b with the buried resin 16 makes it possible to prevent or at least greatly suppress crack creation.

It should be noted that although in the embodiment 3 the laminate bodies are made up of mere two units, the inventive concepts as disclosed herein may also be applicable to the case of more than three laminate bodies used. For example, in case two semiconductor chips are stacked above the semiconductor chip 13 (13c) to form a laminate body, resin is buried into a gap between this body and the laminate body 19b. Also note that the above-stated semiconductor chips are organized into the three-layer structure, this multilayer structure may alternatively be modified into a two-layer or four-layer structure when a need arises.

EMBODIMENT 4

Figure 7:
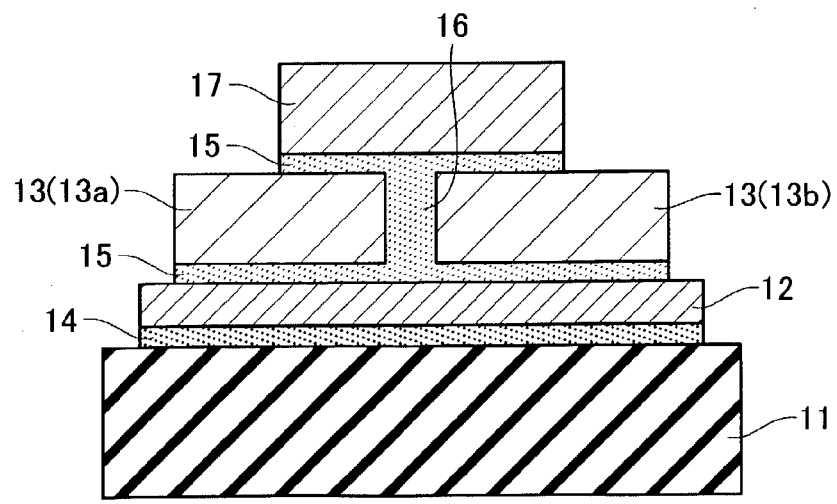
FIG. 7 is a sectional diagram of a semiconductor device in accordance with an embodiment 4.

Lastly, an embodiment 4 will be explained with reference to FIG. 7. This drawing shows a sectional view of a semiconductor device in accordance with the embodiment 4. Parts or components corresponding to those of the embodiment 1 shown in FIG. 1 are referenced with the same reference characters, and a detailed explanation thereof is omitted. The semiconductor device of the embodiment 4 is arranged to have a semiconductor chip 17 atop a pair of neighboring semiconductor chips 13. This chip 17 is laid out in such a manner as to bridge between two laterally adjacent chips 13a, 13b. In other words, chip 17 has its a side edge overlying one chip 13a and an opposite side edge overlying the other chip 13b. With such an arrangement, it is possible to further enhance the resistance to cracking or anti-crack property at a specific portion of the silicon interposer 12 which lies between the semiconductor chips 13.

It should be noted that the semiconductor chip (for example, chip 13a and 13b) on which another semiconductor chip is located has the (almost) same thickness as that of the silicon interposer 12 in the embodiments 3 and 4.

In the embodiments 1 to 4 stated supra, the second substrate in which more than one conductive plug penetrating between its upper and lower surfaces is buried is employed as the silicon interposer 12. However, in case the second substrate is less in thickness (e.g. 50 µm) and is made of relatively brittle material, these embodiments may be applied thereto while not limiting to silicon. A typical example of such material is glass and ceramic.

It has been stated that according to this invention, in multi-chip semiconductor device structures with a plurality of semiconductor chips mounted, it is possible by filling an empty space between adjacent semiconductor chips with the buried resin material to preclude or at least greatly suppress unwanted creation of cracks due to thermal stress.

While the present invention has been particularly shown and described with reference to the embodiments, it will be understood by those skilled in the art that various changes in form and in detail may be made without departing from the spirit, scope and teachings of the invention.

What is claimed is:

1. A semiconductor device comprising:
a first substrate with wiring formed thereon;
a second substrate mounted above said first substrate with a conductive plug buried in said second substrate to penetrate between upper and lower surfaces thereof;
a plurality of semiconductor chips mounted above said second substrate and having a terminal electrode electrically connected to said first substrate through the conductive plug of said second substrate;
a resin buried in a space between adjacent ones of said plurality of semiconductor chips; and
a bump disposed between said terminal electrode and said conductive plug, wherein
said plurality of semiconductor chips include at least first and second adjacent neighboring semiconductor chips,
first and second stacked ones of said plurality of semiconductor chips respectively vertically stacked above the first and second neighboring semiconductor chips, such that the first neighboring and first stacked semiconductor chips comprise a first laminate body and the second neighboring and the second stacked semiconductor chips comprise a second laminate body, and
said resin is buried in an empty space between said first laminate body and said second laminate body;
said semiconductor device further comprising
additional resin contacting between the vertically stacked first and second neighboring and first and second stacked semiconductor chips, respectively, to seal a space therebetween.

2. The semiconductor device according to claim 1, wherein said second substrate includes any one of a silicon substrate, a glass substrate and a ceramic substrate.

3. The semiconductor device according to claim 1, wherein resin sealing is done between said first substrate and said second substrate and also between said second substrate and said semiconductor chips.

4. The semiconductor device according to claim 1, wherein the space between adjacent ones of said plurality of semiconductor chips has a width of 1 millimeter or less.

5. A semiconductor device comprising:
a first substrate with wiring formed thereon;
a second substrate mounted above said first substrate with a conductive plug buried in said second substrate to penetrate between upper and lower surfaces thereof;
a plurality of semiconductor chips mounted above said second substrate and having a terminal electrode electrically connected to said first substrate through the conductive plug of said second substrate;

a resin buried in a space between adjacent ones of said plurality of semiconductor chips;

a bump disposed between said terminal electrode and said conductive plug;

another semiconductor chip disposed to cover said resin while overlying at least one pair of neighboring semiconductor chips of said plurality of semiconductor chips and bridging from one to the other thereof; and additional resin contacting between said another semiconductor chip and said one pair of neighboring semiconductor chips to seal a space therebetween.

6. The semiconductor device according to claim 5, wherein said second substrate includes any one of a silicon substrate, a glass substrate and a ceramic substrate.

7. The semiconductor device according to claim 5, wherein resin sealing is done between said first substrate and said second substrate and also between said second substrate and said semiconductor chips.

8. The semiconductor device according to claim 5, wherein the space between adjacent ones of said plurality of semiconductor chips has a width of 1 millimeter or less.

* * * * *